(12) United States Patent
Hung et al.

(10) Patent No.: US 7,863,094 B2
(45) Date of Patent: Jan. 4, 2011

(54) METHOD FOR REMOVING BUBBLES FROM ADHESIVE LAYER OF SEMICONDUCTOR CHIP PACKAGE

(75) Inventors: Shu-Hui Hung, Hsinchu (TW); Yu-Cheng Chen, Miaoli (TW)

(73) Assignee: Ableprint Technology Co., Ltd., Hsinchu (TW)

( * ) Notice: Subject to any disclaimer, the term of this patent is extended or adjusted under 35 U.S.C. 154(b) by 245 days.

(21) Appl. No.: 12/289,809

(22) Filed: Nov. 5, 2008

(65) Prior Publication Data
US 2009/0124044 A1 May 14, 2009

(30) Foreign Application Priority Data
Nov. 9, 2007 (TW) .............. 96142523 A

(51) Int. Cl.
*H01L 21/00* (2006.01)
(52) U.S. Cl. .......... 438/107; 438/108; 438/109; 257/E21.499
(58) Field of Classification Search .......... 257/E21.499; 438/107, 108, 109
See application file for complete search history.

(56) References Cited

U.S. PATENT DOCUMENTS
2009/0286355 A1* 11/2009 Yeh .............. 438/108

* cited by examiner

*Primary Examiner*—Bradley K Smith
*Assistant Examiner*—Marvin Payen
(74) *Attorney, Agent, or Firm*—Rosenberg, Klein & Lee

(57) ABSTRACT

In a method for removing bubbles from adhesive layer of semiconductor chip package, one or more semiconductor chips are attached to or stacked on a base plate using an adhesive material. The base plate is selected from a substrate, a lead frame, and other carrier for carrying the semiconductor chips thereon. Before the adhesive material starts curing or becomes fully cured, the base plate with the semiconductor chips is placed in a processing tank which is preset to heat at a predetermined heating rising rate to a predetermined temperature and to apply a predetermined pressure for a predetermined period of time, so that bubbles presented in the adhesive material, at an interface between the adhesive material and the base, and at an interface between the adhesive material and the semiconductor chip are expelled from the adhesive material under the temperature and pressure in the processing tank.

7 Claims, 9 Drawing Sheets

METHOD FOR REMOVING BUBBLES FROM ADHESIVE LAYER OF SEMICONDUCTOR CHIP PACKAGE

FIELD OF THE INVENTION

The present invention relates generally to a semiconductor chip packaging technology, and more particularly to a method for removing bubbles from adhesive layer of semiconductor chip package.

BACKGROUND OF THE INVENTION

Semiconductor chip packaging provides four major functions, that is, power input, signal communication, heat dissipation, and chip protection. The semiconductor chip is driven by external power supply to work. Through semiconductor chip packaging, the external power supply may stably supply power to drive the semiconductor chip to work. The semiconductor chip packaging also enables good signal communication, including the transmission of signals generated by the semiconductor chip and the receipt of signals transmitted to the semiconductor chip. Primarily, these functions are achieved through circuits disposed on a base plate on which the semiconductor chip packaging is carried.

The semiconductor chip will generate a large amount of heat during working or receiving signals transmitted thereto. With a heat transfer mechanism provided by the semiconductor chip package for efficiently dissipating the heat generated by the working system, the semiconductor chip is able to work at normal working temperature. However, in the event there are bubbles presented in the semiconductor chip package, the heat generated by the working system would lead to thermal expansion of moisture contained in the bubbles. The expanded bubbles will directly adversely affect the reliability and quality of the product. Therefore, it is always an important issue in the semiconductor industry to remove bubbles from the semiconductor chip package.

In the conventional semiconductor chip packaging process, a wafer is first cut into chips of required sizes, and then, the chips are attached to the base. In the process of applying or curing the adhesive material, bubbles would present in the adhesive material, at an interface between the adhesive material and the base, and at an interface between the adhesive material and the chip. These bubbles result in a plurality of voids in the adhesive material when the latter is cured, and inevitably adversely affect the reliability, the quality, and even the functions of the product.

According to a first conventional method, the bubbles in the adhesive layer are expelled by applying high temperature and high pressure in the process of resin molding for a short period of time. In a second conventional method, the bubbles in the adhesive layer are removed by a vacuuming process. In a third conventional method, the process parameters of the chip implanting machine and other related manufacturing facilities are adjusted to avoid the generation of bubbles at the interface between the chip and the adhesive material.

However, all the above-mentioned conventional methods have some disadvantages. For example, according to the first conventional method, to remove the bubbles from the adhesive material by applying high temperature and high pressure in the process of resin molding for a short period of time, the adhesive material must become cured or at least become cured to a certain degree. This requirement would narrow the conditions for the semiconductor chip packaging process. Moreover, this method has limited effect with respect to chips having relatively large areas because the high temperature and high pressure exist only for a short period of time.

In the case of removing the bubbles in the adhesive layer by vacuuming process, the adhesive material is generally limited to that in the form of paste instead of film. Therefore, the vacuuming process has a very limited range of application. In addition, the bubble removing effect of the vacuuming process is easily affected by the type of material. Therefore, the vacuuming process also narrows the conditions for the semiconductor chip packing process.

In the above-mentioned third method for avoiding bubbles and eliminating voids in the adhesive material, some parameters for the chip implanting machine, such as chip temperature, chip-implanting pressure, and pressure dwell, are adjusted. However, to reach the required wetness at the adhering interface during the chip implantation, it is often needed to raise the chip temperature and increase the chip-implanting pressure and the pressure dwell.

However, all these adjustments tend to adversely affect the chip quality or lead to reduced production efficiency. Moreover, these adjustments are useless to the bubbles presented in the adhesive material. In addition, the effect of these adjustments reduces with increase in the chip size.

SUMMARY OF THE INVENTION

A primary object of the present invention is to provide a method for removing bubbles from adhesive layer of semiconductor chip package, so that bubbles presented in the adhesive material, at an interface between the adhesive material and the base, and at an interface between the adhesive material and the semiconductor chip can be effectively expelled.

Another object of the present invention is to provide a method for increasing the productivity in the semiconductor chip packaging process.

To fulfill the above objects, a method for removing bubbles from adhesive layer of semiconductor chip package is provided. One or more semiconductor chips are attached to or stacked on a base plate using an adhesive material. The base plate may be a substrate, a lead frame, or other carrier for carrying the semiconductor chips thereon for signal transmission. Before the adhesive material starts curing or becomes fully cured, the base plate with the semiconductor chips is placed in a processing tank which is preset to heat at a predetermined heating rising rate to a predetermined temperature and to apply a predetermined pressure for a predetermined period of time, so that bubbles presented in the adhesive material, at an interface between the adhesive material and the base, and at an interface between the adhesive material and the semiconductor chip are expelled from the adhesive material under the temperature and pressure in the processing tank.

According to the method of the present invention, before the adhesive material starts curing or becomes fully cured, the base plate and the semiconductor chips attached thereto is placed in a processing tank. The processing tank is heated at a predetermined heating rate to a predetermined temperature and is applied with a predetermined internal pressure for a predetermined period of time, so that bubbles presented in the adhesive material, at the interface between the adhesive material, and at the interface between the adhesive layer and the semiconductor chip are expelled.

Under the preset temperature and pressure of the processing tank, the bubbles in the adhesive material are energized and expand, such that finally the bubbles are expelled from the adhesive material.

The method of the present invention is able to remove bubbles from the adhesive layer whatever the number and size of the bubbles are and whatever the size of the chip is. Therefore, the method of the present invention is adapted to chips of different sizes to remove bubbles from the adhesive material. Unlike the conventional methods that try to expel the bubbles from the adhesive layer by increasing the time and pressure used to adhere or implant the chips to or on the base, the method of the present invention does not required prolonged time and increased pressure to expel the bubbles. Moreover, bubbles in the process of adhering the chips to the base plate may also be effectively removed with the method of the present invention.

The method of the present invention is applicable to those semiconductor chip packaging demanding specific material performances and manufacturing conditions, no matter whether there are any bubbles presented in the adhesive material when the chip is implanted on the base. Therefore, the temperature, the pressure, and the time required for implanting chips can be reduced to enable increased productivity in the semiconductor chip packaging as well as reduced facility and manufacturing costs.

The method is also applied to the packaging of two or more stacked chips. In an embodiment, after the wire bonding is completed for the first semiconductor chip, a second semiconductor chip is stacked and attached to the first semiconductor chip through a layer of adhesive material coated on a lower surface of the semiconductor chip. The stacked semiconductor chip is put to the processing tank to remove the bubbles. Then wire bonding is processed for the bonding pads on an upper surface of the second semiconductor chip and bonding points on the base or on the bonding pads on the first semiconductor chip. These steps can be repeated for stacking more chips to the second semiconductor chip.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
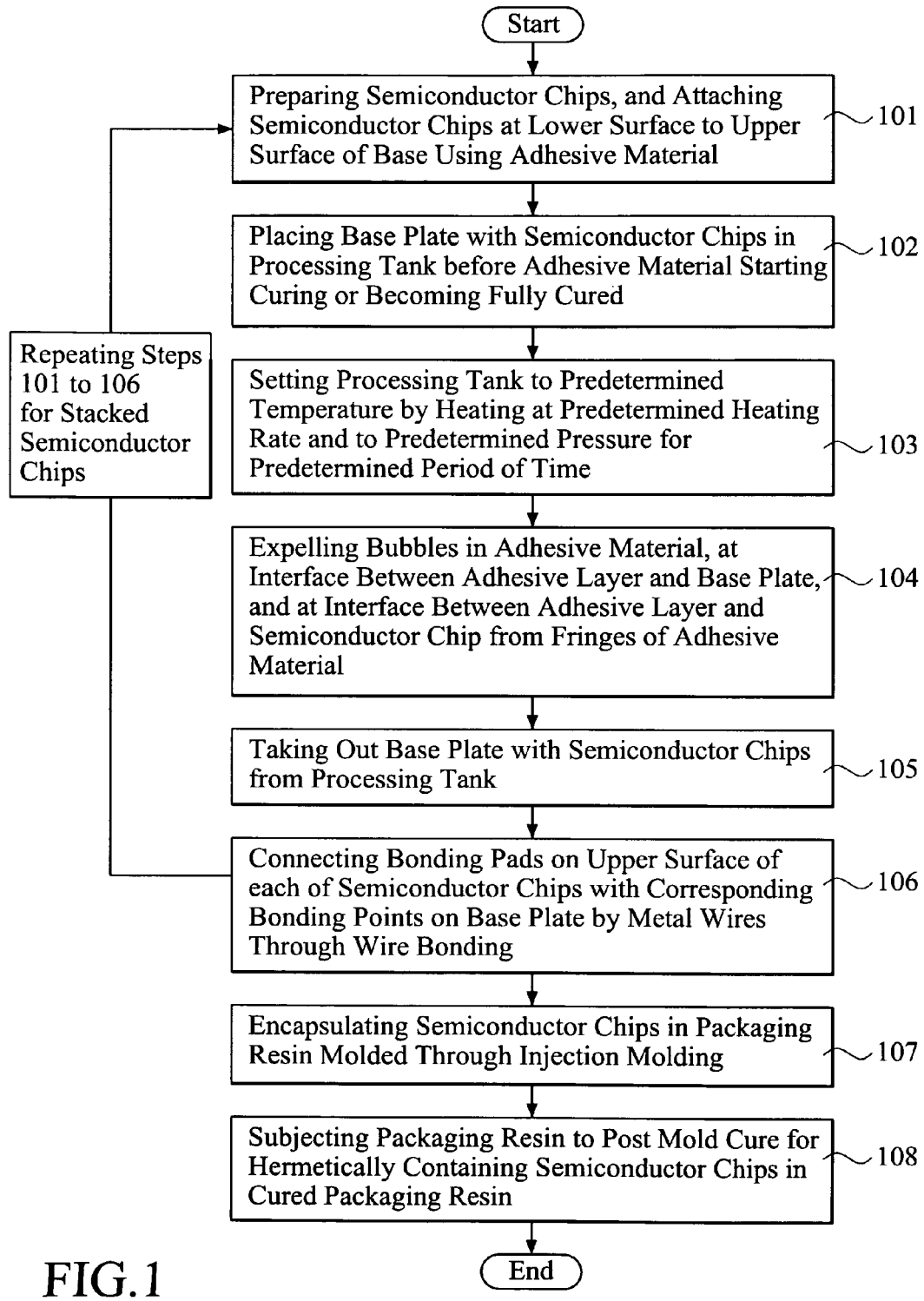
FIG. 1 is a flow chart showing the steps included in a method for removing bubbles from adhesive layer of semiconductor chip package of the present invention.

Please refer to FIG. 1 that is a flow chart showing the steps included in a method for removing bubbles from adhesive layer of semiconductor chip package according to the present invention.

Figure 2:
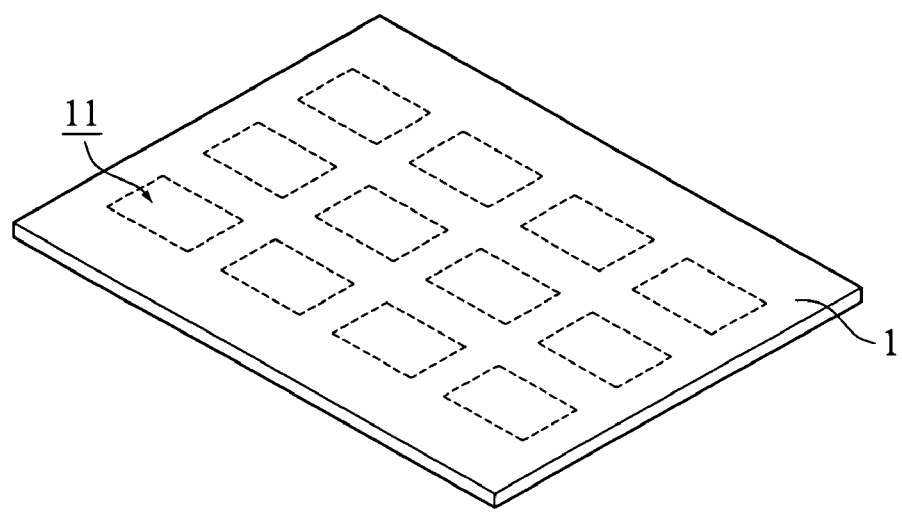
FIG. 2 shows a base plate used in a first embodiment of the present invention, on which a plurality of chip-implanting areas are provided.
Figure 3:
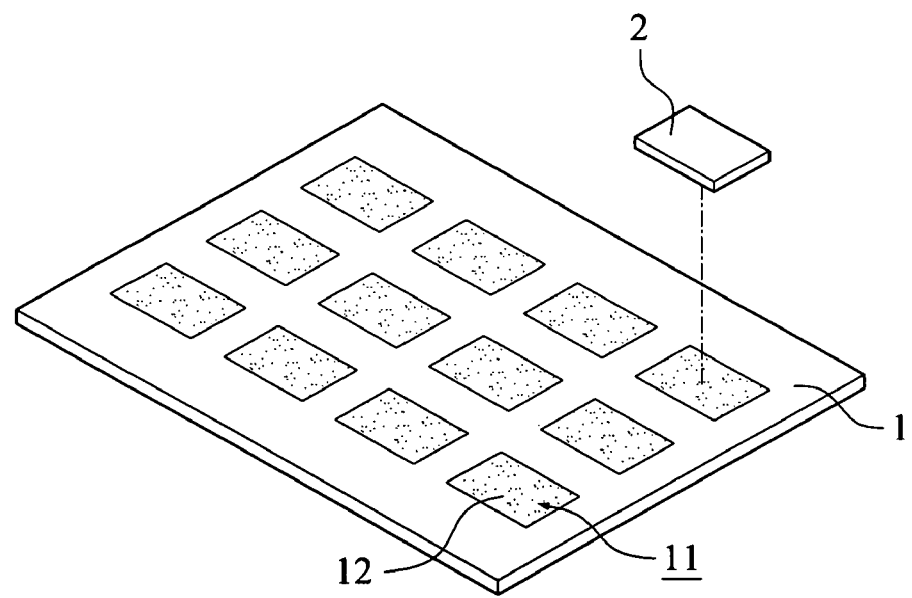
FIG. 3 is a view according to FIG. 2, showing that a semiconductor chip is attached to one chip-implanting area on the base.

According to a first step 101 of the method of the present invention, a base plate 1, such as a substrate, a lead frame, or other carrier that may be used to carry one or more chips thereon for receiving, processing and transmitting electronic signals, is prepared. The base plate 1 is provided on an upper surface with a plurality of chip-implanting areas 11, as shown in FIG. 2. The chip-implanting areas 11 are first coated with a layer of an adhesive material 12. A semiconductor chip 2 is then attached to each of the chip-implanting areas 11 with a lower surface of the semiconductor chip 2 in contact with the adhesive material 12, as shown in FIG. 3.

The adhesive material 12 may comprise thermoplastic or thermosetting resin like polyimide, epoxy resin, and acryl resin so on. Before curing, these materials are sticky upon heating.

Figure 4:
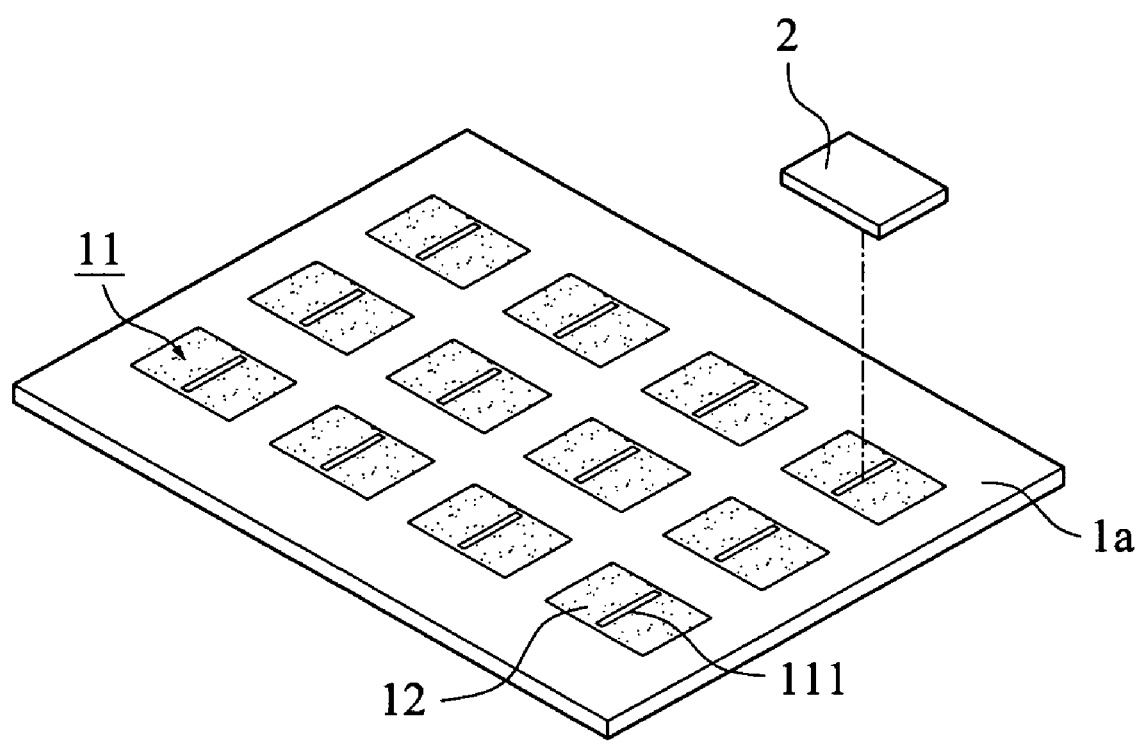
FIG. 4 shows a base plate used in a second embodiment of the present invention, on which a plurality of chip-implanting areas are provided, and a semiconductor chip is attached to each of the chip-implanting areas.

Alternatively, as shown in FIG. 4, the base plate 1 may be replaced with a base plate 1a, on which a plurality of chip-implanting areas 11 are provided and a narrow through hole 111 for extending metal bonding wires is formed on each of the chip-implanting areas 11. The chip-implanting areas 11 on the base plate 1a are first coated with a layer of the adhesive material 12, and the semiconductor chip 2 is then attached to each of the chip-implanting areas 11 with the lower surface of the semiconductor chip 2 in contact with the adhesive material 12.

Alternatively, in step 101, the chip-implanting areas 11 are not first coated with the adhesive material 12. Instead, the adhesive material 12 is applied on the lower surface of the semiconductor chip 2, which is then attached to the chip-implanting area 11 on the base plate 1, 1a.

The subsequent steps 102~105 of the method of the present invention will now be described based on the base plate 1. However, the steps 102~105 are also applicable to the base plate 1a.

Figure 5:
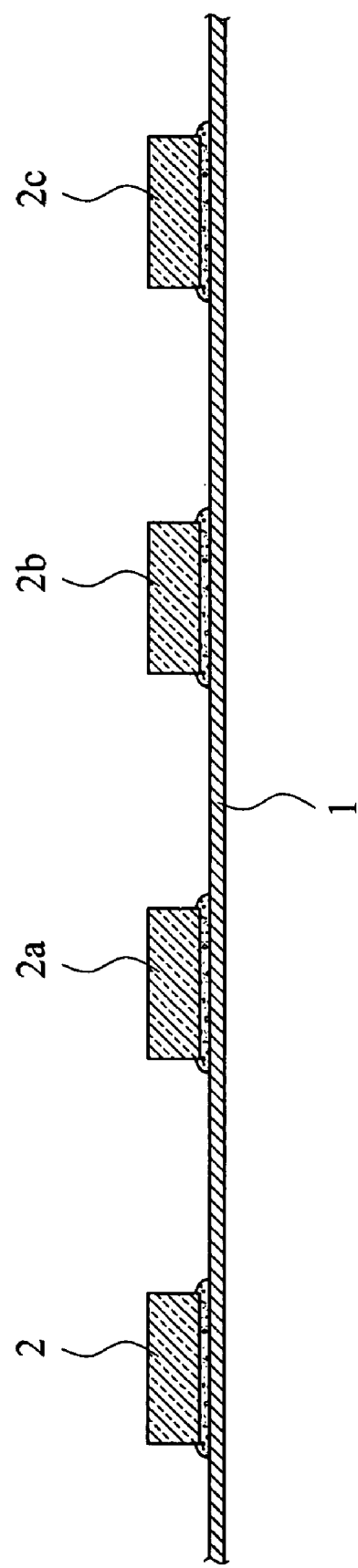
FIG. 5 is a longitudinal sectional view showing a plurality of semiconductor chips are attached to the base plate according to the first embodiment of the present invention.
Figure 6:
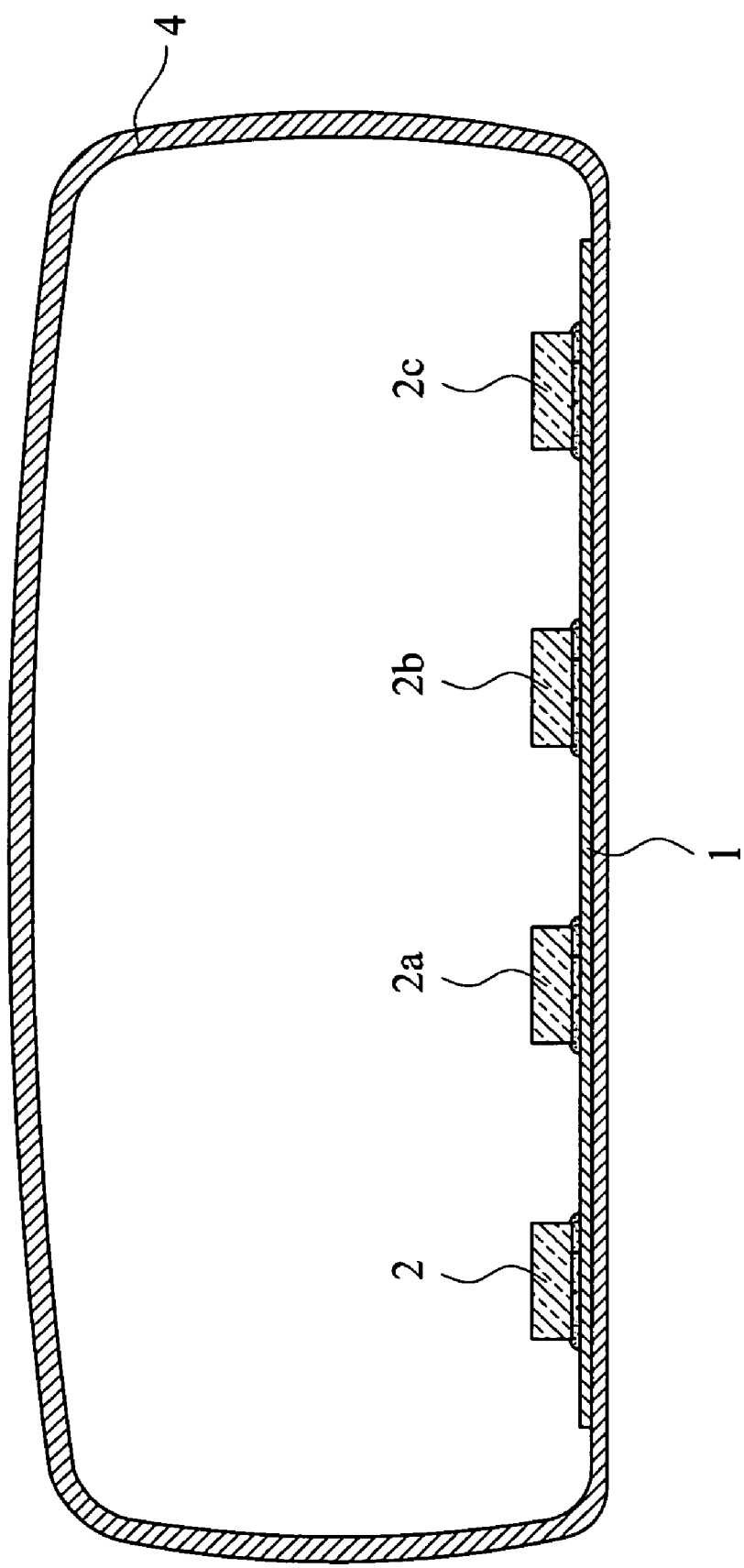
FIG. 6 is a longitudinal sectional view showing the base plate with a plurality of semiconductor chips shown in FIG. 5 are placed in a processing tank according to the first embodiment of the present invention.

In step 102, a plurality of semiconductor chips 2, 2a, 2b, 2c are attached to and implanted in the chip-implanting areas 11 of the base plate 1, as shown in FIG. 5, and the base plate 1 with the semiconductor chips 2, 2a, 2b, 2c is placed in a processing tank 4, as shown in FIG. 6, before the adhesive material 12 between the semiconductor chips 2, 2a, 2b, 2c and the surface of the base plate 1 starts curing or becomes fully cured.

Figure 7:
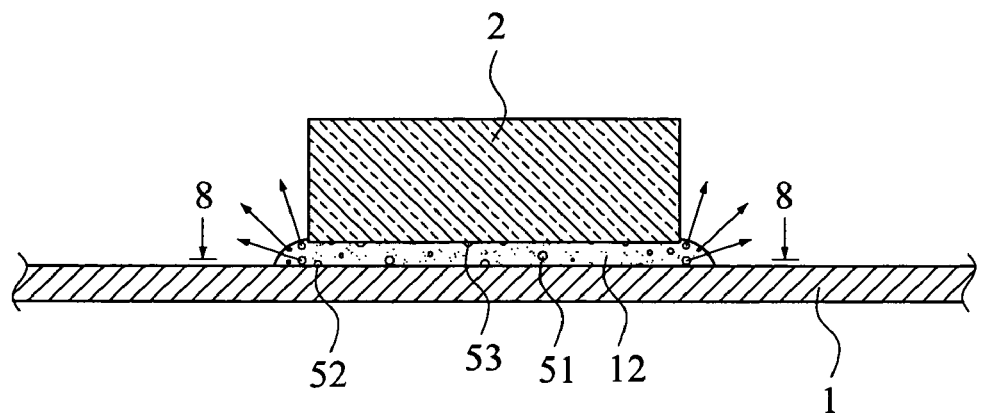
FIG. 7 is a longitudinal sectional view showing that bubbles present in the adhesive layer, at an interface between an adhesive layer and the semiconductor chip, and at an interface between the adhesive layer and the base.
Figure 8:
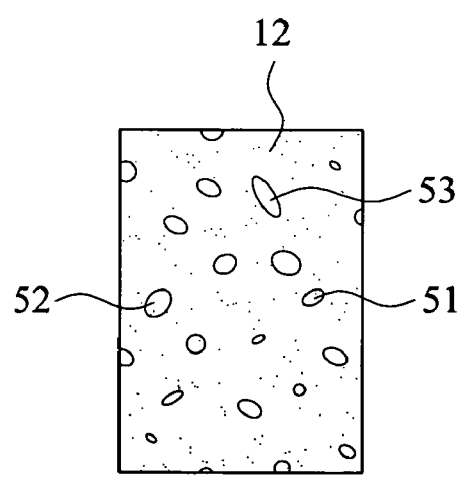
FIG. 8 is a cross-sectional view taken along line 8-8 of FIG. 7.

As shown in FIG. 7, in the process of attaching the semiconductor chip 2 to the base plate 1 via the adhesive material 12, there are bubbles e.g. 51, 52, 53 in the adhesive layer 12, at an interface between the adhesive layer 12 and the base plate 1, and at an interface between the adhesive layer 12 and the semiconductor chip 2, respectively. These bubbles 51, 52, 53 would result in discontinuity in the surfaces of the adhesive material 12, as shown in FIG. 8.

In step 103, to solve the problem of bubbles 51, 52, 53, the processing tank 4 having the base plate 1 with the semiconductor chips 2, 2a, 2b, 2c placed therein is preset to heat at a predetermined heating rate to a predetermined temperature and to apply a predetermined pressure for a given period of time.

In step 104, under the preset physical conditions in the processing tank 4, the bubbles 51 in the adhesive layer 12, the bubbles 52 at the interface between the adhesive layer 12 and the base plate 1, and the bubbles 53 at the interface between the adhesive layer 12 and the semiconductor chip 2 are expelled from the fringes of the adhesive layer 12 in the directions as indicated by the arrows in FIG. 7.

In step 105, after the bubbles are removed, the base plate 1 with the semiconductor chips 2, 2a, 2b, 2c is taken out of the processing tank 4.

Figure 9:
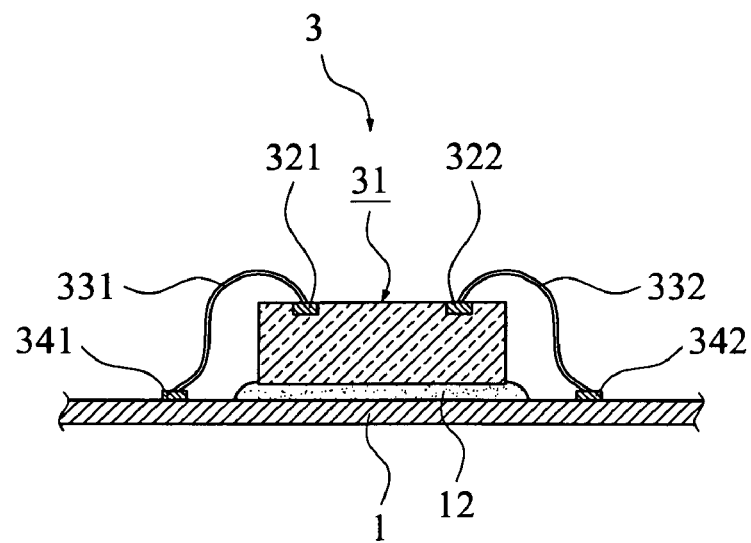
FIG. 9 is a longitudinal sectional view showing the wire bonding for one single semiconductor chip according to the first embodiment of the present invention.

According to step 106 of the method of the present invention, after step 105, bonding pads 321, 322 are disposed on an upper surface 31 of the semiconductor chip 3 and are connected with bonding points 341, 342 disposed on the upper surface of the base plate 1 by metal wires 331, 332 through wire bonding, as shown in FIG. 9.

Figure 10:
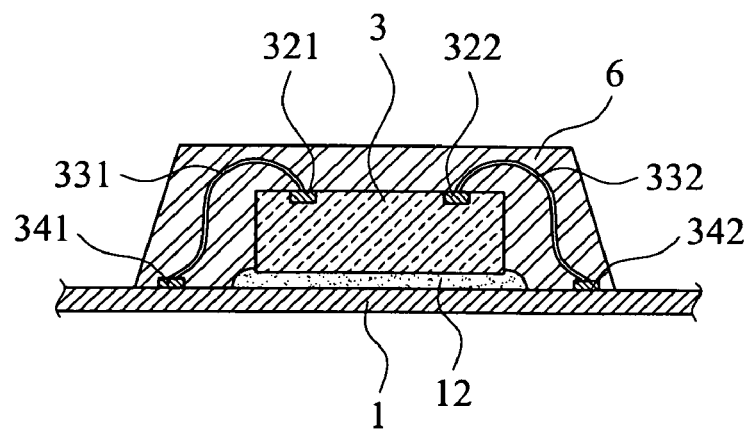
FIG. 10 is a longitudinal sectional view showing the single semiconductor chip of FIG. 9 is encapsulated according to the first embodiment of the present invention.

In step 107, a packaging resin 6 is molded on the upper surface 31 of the semiconductor chip 3 and the bonding wires 331, 332 using a mold (not shown) by way of injection molding, as shown in FIG. 10.

In step 108, the packaging resin 6 is subjected to post mold cure and becomes cured. The fully cured packaging resin 6 would hermetically contain the semiconductor chip 3 therein, protecting the semiconductor chip 3 against external humidity.

Figure 11:
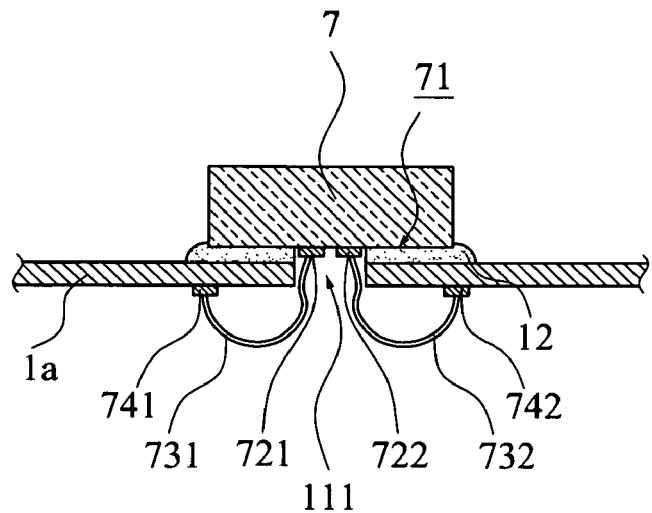
FIG. 11 is a longitudinal sectional view showing the wire bonding for one single semiconductor chip according to a second embodiment of the present invention.
Figure 12:
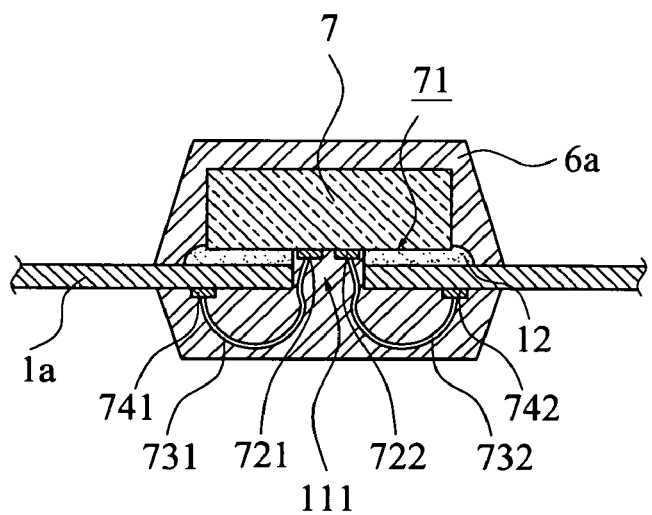
FIG. 12 is a longitudinal sectional view showing the single semiconductor chip of FIG. 11 is encapsulated according to the second embodiment of the present invention.

In the case of the base plate 1a having a semiconductor chip 7 attached to an upper surface of the base plate 1a via the adhesive material 12, the step 106 is conducted as below: after the bubbles are removed from the adhesive material 12, bonding pads 721, 722 disposed on a lower surface 71 of the semiconductor chip 7 and bonding points 741, 742 disposed on a lower surface of the base plate 1a are connected by metal wires 731, 732 through wire bonding. It is noted the metal wires 731, 732 are extended through the through hole 111 to respectively connect the bonding pads 721, 722 with the bonding points 741, 742, as shown in FIG. 11. Thereafter, in step 107, the semiconductor chip 7 and the bonding wires 731, 732 are encapsulated in a packaging resin 6a molded by way of injection molding, as shown in FIG. 12.

The method for removing bubbles from adhesive layer of semiconductor chip package according to the present invention is also applicable to the packaging of two or more stacked chips. When step 101~106 as shown in FIG. 1 have been completed for a first semiconductor chip 3, steps 101~106 can be repeated for each of the following chips to be sequentially stacked on the first chip 3.

Figure 13:
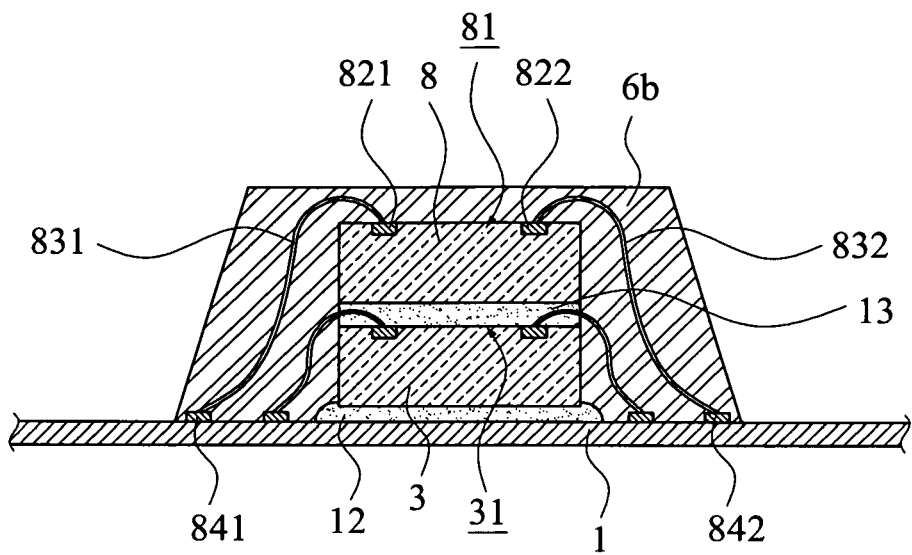
FIG. 13 is a longitudinal sectional view showing two stacked semiconductor chips are encapsulated according to the first embodiment of the present invention.

Referring to FIG. 13, when the wire bonding has been completed for the first semiconductor chip 3 attached to the upper surface of the base plate 1, a second semiconductor chip 8 having a layer of adhesive material 13 coated on a lower surface thereof is stacked on the first semiconductor chip 3 with the adhesive material 13 in contact with the upper surface 31 of the first semiconductor chip 3 to form a semi-finished product. Then, the semi-finished product is placed in the processing tank 4 for removing bubbles from the layer of adhesive material 13.

After the bubbles are removed, bonding pads 821, 822 disposed on an upper surface 81 of the second semiconductor chip 8 and bonding points 841, 842 disposed on the upper surface of the base plate 1 are respectively connected by metal wires 831, 832 through wire bonding. Finally, the semiconductor chips 3 and 8 and all the bonding wires are encapsulated in a packaging resin 6b molded by way of injection molding, as shown in FIG. 13.

Figure 14:
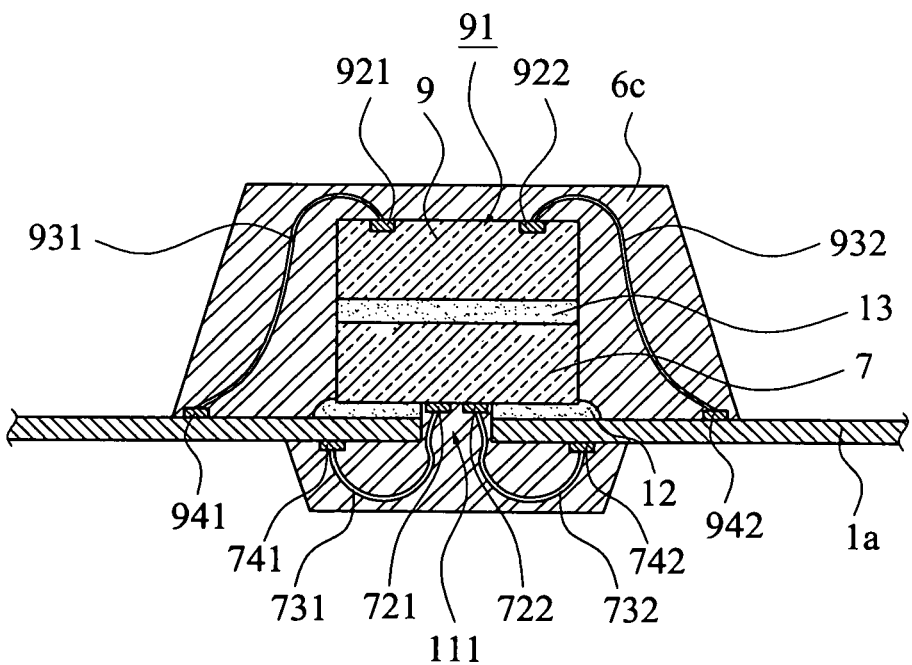
FIG. 14 is a longitudinal sectional view showing two stacked semiconductor chips are encapsulated according to the second embodiment of the present invention.

Referring to FIG. 14, in the case of the base plate 1a having the semiconductor chip 7 attached to the upper surface of the base plate 1a via the adhesive material 12, when the wire bonding has been completed for the first semiconductor chip 7, a second semiconductor chip 9 having a layer of adhesive material 13 coated on a lower surface thereof is stacked on the first semiconductor chip 7 with the adhesive material 13 in contact with an upper surface of the first semiconductor chip 7 to form a semi-finished product. Then, the semi-finished product is placed in the processing tank 4 for removing the bubbles from the layer of adhesive material 13.

After the bubbles have been removed from the layer of adhesive material 13, the bonding pads 921, 922 disposed on an upper surface 91 of the second semiconductor chip 9 and the bonding points 941, 942 disposed on the upper surface of the base plate 1a are connected by metal wires 931, 932. Thereafter, the stacked semiconductor chips 7, 9 and all the bonding wires are encapsulated in a packaging resin 6c molded by way of injection molding, as shown in FIG. 14.

Although the present invention has been described with reference to the preferred embodiments thereof, it is apparent to those skilled in the art that a variety of modifications and changes may be made without departing from the scope of the present invention which is intended to be defined by the appended claims.

What is claimed is:
1. A method for removing bubbles from an adhesive layer of a semiconductor chip package, comprising the steps of:
   (a) attaching at least one first semiconductor chip on an upper surface of a base plate by the adhesive material;
   (b) placing the base plate with the first semiconductor chip attached thereto in a processing tank before the adhesive material starts curing or becomes fully cured;
   (c) setting the processing tank to a predetermined temperature and a predetermined pressure for a predetermined period of time;
   (d) expelling bubbles in the adhesive material, at an interface between the adhesive layer and the base plate, and at an interface between the adhesive layer and the first semiconductor chip from at least one fringe of the adhesive material;
   (e) taking out the base plate and the first semiconductor chip attached thereto from the processing tank;
   (f) coating a layer of the adhesive material on a lower surfaces of at least one second semiconductor chip, and attaching the second semiconductor chip to an upper surface of the first semiconductor chip, so as to stack the second semiconductor chip on the first semiconductor chip and form a semi-finished product; placing the semi-finished product in the processing tank; repeating the above steps (b), (c), and (d) to remove bubbles from the adhesive material coated on the lower surface of the second semiconductor chip; and then, taking out the semi-finished product from the processing tank; and (g) repeating the above step (f) to sequentially stack another semiconductor chip on the second semiconductor chip.

2. The method as claimed in claim 1, wherein, in step (c), the predetermined temperature in the processing tank is ranged between 80° C. and 175° C.

3. The method as claimed in claim 1, wherein, in the step (c), the predetermined pressure in the processing tank is larger than 2 atmospheres.

4. The method as claimed in claim 1, wherein, in the step (c), the predetermined period of time is longer than 5 minutes.

5. The method as claimed in claim 1, further comprising a step of wire bonding after the step (e).

6. The method as claimed in claim 1, further comprising a step of wire bonding after the step (f).

7. The method as claimed in claim 5, further comprising the following steps after the step (g):

(h) encapsulating chips in a packaging resin; and (i) treating the packaging resin by way of a curing process for hermetically containing chips in the cured packaging resin.

* * * * *